(12) United States Patent
Johnson et al.

(10) Patent No.: US 10,367,107 B2
(45) Date of Patent: Jul. 30, 2019

(54) MULTIJUNCTION PHOTOVOLTAIC DEVICE HAVING AN SI BARRIER BETWEEN CELLS

(71) Applicant: IQE PLC., Cardiff (GB)

(72) Inventors: Andrew Johnson, Newport (GB); Andrew William Nelson, Cowbridge (GB); Robert Cameron Harper, Newport (GB)

(73) Assignee: IQE PLC, Cardiff (GB)

( * ) Notice: Subject to any disclaimer, the term of this patent is extended or adjusted under 35 U.S.C. 154(b) by 0 days.

(21) Appl. No.: 15/382,181

(22) Filed: Dec. 16, 2016

(65) Prior Publication Data

US 2017/0117429 A1    Apr. 27, 2017

Related U.S. Application Data

(63) Continuation of application No. 14/241,987, filed as application No. PCT/GB2012/051982 on Aug. 14, 2012.

(Continued)

(51) Int. Cl.
*H01L 31/0725*    (2012.01)
*H01L 31/0328*    (2006.01)
(Continued)

(52) U.S. Cl.
CPC ......... *H01L 31/0328* (2013.01); *H01L 29/16* (2013.01); *H01L 29/20* (2013.01);
(Continued)

(58) Field of Classification Search
CPC .......... H01L 31/0725; H01L 31/03044; H01L 31/0735; H01L 31/074; H01L 31/06875;
(Continued)

(56) References Cited

U.S. PATENT DOCUMENTS

| 6,252,287 B1 | 6/2001 | Kurtz et al. |
| 6,340,788 B1 * | 1/2002 | King ................. H01J 37/3023 136/255 |

(Continued)

FOREIGN PATENT DOCUMENTS

| EP | 1109230 | 6/2001 |
| EP | 1798777 A2 | 6/2007 |

(Continued)

OTHER PUBLICATIONS

The International Search Report and Written Opinion issued by the European Patent Office dated Feb. 4, 2013 for the PCT application No. PCT/GB2012/051982.

(Continued)

*Primary Examiner* — William F Kraig
*Assistant Examiner* — Khatib A Rahman
(74) *Attorney, Agent, or Firm* — Jackson Walker LLP; Christopher J. Rourk; Thomas B. Hayes

(57) ABSTRACT

A photovoltaic device, particularly a solar cell, comprises an interface between a layer of Group III-V material and a layer of Group IV material with a thin silicon diffusion barrier provided at or near the interface. The silicon barrier controls the diffusion of Group V atoms into the Group IV material, which is doped n-type thereby. The n-type doped region can provide the p-n junction of a solar cell in the Group IV material with superior solar cell properties. It can also provide a tunnel diode in contact with a p-type region of the III-V material, which tunnel diode is also useful in solar cells.

20 Claims, 9 Drawing Sheets

Related U.S. Application Data

(60) Provisional application No. 61/528,650, filed on Aug. 29, 2011.

(51) Int. Cl.

| | |
|---|---|
| *H01L 31/0687* | (2012.01) |
| *H01L 31/0304* | (2006.01) |
| *H01L 31/0735* | (2012.01) |
| *H01L 31/074* | (2012.01) |
| *H01L 31/18* | (2006.01) |
| *H01L 31/0216* | (2014.01) |
| *H01L 29/16* | (2006.01) |
| *H01L 29/20* | (2006.01) |
| *H01L 29/267* | (2006.01) |
| *H01L 31/068* | (2012.01) |

(52) U.S. Cl.
CPC ...... *H01L 29/267* (2013.01); *H01L 31/02167* (2013.01); *H01L 31/03044* (2013.01); *H01L 31/068* (2013.01); *H01L 31/0687* (2013.01); *H01L 31/06875* (2013.01); *H01L 31/074* (2013.01); *H01L 31/0725* (2013.01); *H01L 31/0735* (2013.01); *H01L 31/1812* (2013.01); *H01L 31/1844* (2013.01); *Y02E 10/544* (2013.01); *Y02P 70/521* (2015.11)

(58) Field of Classification Search
CPC ............... H01L 31/0693; H01L 31/073; H01L 31/0749; H01L 31/1032–1037; H01L 31/1804; H01L 31/1808; H01L 31/1828–1856; H01L 31/202; H01L 33/0025; H01L 33/0029; H01L 33/0054; H01L 33/0062–0075; H01L 33/0083–0091; H01L 33/28–34; H01L 31/04–078; H01L 31/0216–02168; H01L 31/0328; H01L 31/068
See application file for complete search history.

(56) References Cited

U.S. PATENT DOCUMENTS

| | | | |
|---|---|---|---|
| 6,380,601 B1 | 4/2002 | Ermer et al. | |
| 7,872,252 B2 | 1/2011 | Puetz et al. | |
| 2002/0040727 A1 | 4/2002 | Stan et al. | |
| 2002/0117675 A1 | 8/2002 | Mascarenhas | |
| 2003/0015728 A1 | 1/2003 | Bosco et al. | |
| 2005/0155641 A1 | 7/2005 | Fafard | |
| 2006/0162768 A1 | 7/2006 | Wanlass et al. | |
| 2008/0257405 A1 | 10/2008 | Sharps | |
| 2009/0014061 A1 | 1/2009 | Harris, Jr. et al. | |
| 2010/0282307 A1 | 11/2010 | Sharps et al. | |
| 2011/0083729 A1 | 4/2011 | Lee et al. | |
| 2011/0232730 A1 | 9/2011 | Jones et al. | |
| 2011/0303273 A1 | 12/2011 | Harper | |
| 2012/0103403 A1 | 5/2012 | Misra et al. | |

FOREIGN PATENT DOCUMENTS

| | | |
|---|---|---|
| GB | 2467934 A | 8/2010 |
| GB | 2467935 | 8/2010 |
| JP | 2002-540635 A | 11/2002 |
| JP | 2010-500741 A | 1/2010 |
| WO | WO87/02183 A1 | 4/1987 |
| WO | WO00/59045 A2 | 10/2000 |
| WO | WO2008/017143 A1 | 2/2008 |
| WO | 2009157870 | 12/2009 |
| WO | WO2010/094919 A2 | 8/2010 |
| WO | WO2010/102345 A1 | 9/2010 |

OTHER PUBLICATIONS

The International Preliminary Report on Patentability issued by the European Patent Office dated Mar. 4, 2014 for the PCT application No. PCT/GB2012/051982.
The Examination Report issued by the Australian Patent Office dated Aug. 19, 2016 for the co-pending Australian patent application No. 2016200282.
The First Office Action issued by the China State Intellectual Property Office dated Aug. 26, 2015 for the co-pending Chinese patent application No. 201280049676.9.
The Second Office Action issued by the China State Intellectual Property Office dated Jun. 28, 2016 for the co-pending Chinese patent application No. 201280049676.9.
The Brief report of the Office Action in English issued by the Japanese Patent Office dated Jun. 1, 2016 for the co-pending Japanese patent application No. 2014-527730.
Strite et al., "Si as a diffusion barrier for Ge/GaAs heterojunctions", American Institute of Physics, Apr. 23, 1990, pp. 1673-1675, col. 56, No. 17.
International Search Report and Written Opinion issued by the European Patent Office dated Dec. 5, 2012 for International Application No. PCT/GB2012/051980.
Janotti et al., "Theoretical Study of the Effects of Isovalent Coalloying of Bi and N in GaAs" Physical Review B, 2002, vol. 65 115203-1-5.
Tixier et al., "Molecular Beam Epitaxy Growth of GaAs1-xBix" Applied Physics Letter 2003, pp. 2245, vol. 182, No. 14.
International Search Report and Written Opinion issued by the European Patent Office dated Dec. 5, 2012 for International Application No. PCT/GB2012/051981.
International Preliminary Report on Patentability issued by the International Bureau of WIPO dated Mar. 4, 2014 for International Application No. PCT/GB2012/051981.
Restriction Requirement dated Oct. 27, 2016 for U.S. Appl. No. 14/342,061, 9 pages.
Non-Final Office Action dated Apr. 5, 2017 for U.S. Appl. No. 14/342,061, 14 pages.
Non-Final Office Action dated Oct. 26, 2017 for U.S. Appl. No. 14/342,061, 13 pages.
Final Office Action dated Mar. 7, 2018 for U.S. Appl. No. 14/342,061, 17 pages.
Non-Final Office Action dated Jul. 7, 2015 for U.S. Appl. No. 14/342,016, 18 pages.
Final Office Action dated Mar. 14, 2016 for U.S. Appl. No. 14/342,016, 16 pages.
Non-Final Office Action dated Jul. 14, 2017 for U.S. Appl. No. 14/342,016, 23 pages.
Final Office Action dated Nov. 2, 2017 for U.S. Appl. No. 14/342,016, 26 pages.
Non-Final Office Action dated May 29, 2018 for U.S. Appl. No. 14/342,016, 26 pages.

* cited by examiner

MULTIJUNCTION PHOTOVOLTAIC DEVICE HAVING AN SI BARRIER BETWEEN CELLS

The present application is a continuation patent application of Ser. No. 14/241,987 filed Oct. 22, 2014, which is a 35 U.S.C 371(c) National Stage Application of International Application No. PCT/GB2012/051982, filed Aug. 14, 2012, which claims priority from U.S. provisional application Ser. No. 61/528,650 filed Aug. 29, 2011, which are hereby incorporated by reference.

BACKGROUND OF THE INVENTION

One well-known kind of photovoltaic device has two or more cells connected in series formed from a vertical layer structure of semiconductor materials, each cell containing a p-n junction of a different bandgap, which junctions are used to absorb different parts of the spectrum of the light falling on the device (Tandem Cell). The majority of multi-junction photovoltaic devices that are currently in use are manufactured on a germanium substrate.

FIG. 1 shows the typical structure of the lower cell in such a device. A p-type germanium (Ge) substrate 1 is provided and the first p-n junction 2 of the device is fabricated by growing a layer 3 of a III-V semiconductor material onto the germanium substrate, the two meeting at interface 8. This layer 3 is termed, in the art, a nucleation layer. At the elevated temperatures used during processing, Group V atoms from the nucleation layer 3 diffuse across the interface into the germanium substrate creating the p-n junction 2 at a point below the surface of the germanium. The junction forms because the Group V atoms act as an n-type dopant in the germanium and so when they have diffused in sufficient concentration an n-type region 4 is formed. (The other border of the n-type region 4 is of course the interface 8 between the III-V and the Group IV materials.) The Group III-V layer 3 is provided n-type so that there is low resistance contact between that and the Group IV n-type region 4. Control of the depth of the diffusion of the Group V atoms is important in defining the quality of the p-n junction, with a shallower junction being preferable. Diffusion is controlled by the temperature and duration of the growth and annealing (and any other processing) of both the nucleation layer 3 of any further semiconductor layers 5. The further layers 5 of semiconductor are provided to form one or more further p-n junctions for absorbing different parts of the spectrum. Examples of multi-junction solar cells having a bottom cell similar to FIG. 1 are given by U.S. Pat. No. 6,380,601 and US 2002/0040727.

A paper *Si as a diffusion barrier in Ge/GaAs hetero junctions* by S. Strite, M. S. Ünlü, K. Adomi, and H. Morkoç (Appl. Phys Lett. 56(17)) was published in 1990. The authors of this paper were interested in phototransistors and hole based modulation doped structures, and the paper itself discussed their investigation of a diode formed of a gallium arsenide epitaxial layer overgrown with germanium. This basic diode was said to suffer from microplasma assisted breakdown caused by poor sample uniformity caused, they suggest, by vacancies in the GaAs (caused in turn by Ga and As outdiffusion into the Ge). An interlayer of pseudomorphic silicon of 10 Å in thickness was provided to prevent this. (The germanium was p-type, being doped with Ga to a concentration of $5 \times 10^{18}$ cm$^{-3}$. The GaAs at the junction was more lightly doped, to a concentration of $5 \times 10^{16}$ cm$^{-3}$, with silicon.) In particular it may be controlled to a predetermined depth.

Solar cells are used to generate electrical power, preferably from sunlight. They may be used directly irradiated by the sun or with concentrators that gather sunlight onto the cell in a higher concentration, which improves their efficiency.

SUMMARY OF THE INVENTION

According to the present invention, there is provided a semiconductor material comprising:
 a Group IV semiconductor material layer, the material not being silicon,
 a layer of Group III-V semiconductor material formed of at least one kind of Group III atoms and at least one kind of Group V atoms, and having an interface with the Group IV semiconductor layer,
 a silicon layer either at the interface between III-V semiconductor layer and the Group IV semiconductor layer, or in either the Group IV semiconductor layer, or the III-V semiconductor layer, spaced from the interface,
 an n-type Group V doped region in the Group IV semiconductor layer that has a border with the interface and that is doped by Group V atoms of at least one of the kinds of those forming the Group III-V semiconductor layer.

The silicon layer acts to control the diffusion of the Group V atoms into the Group IV layer (by reducing it), and hence controls the doping of the Group IV layer in terms of its depth and concentration. Further changing the thickness of the Si layer allows doping to be changed for different requirements. In this way the doping of the Group IV layer can be controlled as desired.

That part of the n-type Group V doped region in the Group IV semiconductor layer that is to a particular side of the silicon layer may be doped by Group V atoms of at least one of the kinds of those forming that part the Group III-V semiconductor that is on the opposite side of the silicon layer.

At least some of the Group V atoms doping that part of the Group IV semiconductor layer that is to a particular side of the silicon layer may be from that part of the Group III-V layer that is on the opposite side of the silicon layer.

The n-type Group V doped region in the Group IV semiconductor layer may be doped by Group V atoms of at least one of the kinds of those forming a region of the Group III-V semiconductor layer that borders the interface.

The Group V doped region in the semiconductor layer may provide a p-n junction with a p-type region in the Group IV layer.

The Group III-V material at the interface may be n-type.
The Group III-V material layer may be n-type.
Alternatively, the Group V doped region in the Group IV layer and the Group III-V layer may form a tunnel diode at the interface. The Group III-V material at the interface may be p-doped.

The Group IV semiconductor material layer may be germanium, or may be silicon-germanium, or may be silicon-germanium-tin.

The Group III-V material may comprise Group III atoms that are one or more of Al, Ga, In and may comprise Group V atoms that are one or more or P, As, Sb, Bi. The Group III-V material may comprise a material selected from the group consisting of InGaAsP, AlGaAs, AlGaAsP, GaAs, GaAsP, AlAs, InGaP, InGaAs, AlInGaAs, AlInGaP.

The Group IV layer may comprise an epitaxial Group IV semiconductor layer between the silicon layer and the III-V semiconductor layer.

The Group III-V semiconductor layer may comprise an epitaxial Group III-V semiconductor layer between the silicon layer and the Group IV semiconductor layer.

The Group IV semiconductor layer may comprise a substrate layer and an epitaxial layer grown on the substrate layer.

Preferably, the silicon layer has a thickness of less than or equal to 7.5 Å or may have less than or equal to 3 atomic layers. The silicon may have less than or equal to 1 atomic layer, or may have less than 1 atomic layer.

The concentration of the doping of the Group III-V semiconductor layer bordering the interface may be greater than $1\times10^{17}$ atoms per $cm^3$, or may be greater than $1\times10^{18}$ atoms per $cm^3$, or may be between than $1\times10^{18}$ and $5\times10^{18}$ atoms per $cm^3$.

The concentration of the Group V atoms of the doping of the n-type Group V doped region in the Group IV semiconductor layer may be greater than $1\times10^{17}$ atoms per $cm^3$, or may be greater than $1\times10^{18}$ atoms per $cm^3$, or may be greater than $6\times10^{18}$ atoms per $cm^3$.

The doping concentration of the Group IV layer not doped by the Group V atoms may be less than $4\times10^{18}$ atoms per $cm^3$, or may be between $5\times10^{16}$ and $2\times10^{18}$ atoms per $cm^3$, or may be between $1\times10^{17}$ and $1\times10^{18}$ atoms per $cm^3$.

The semiconductor material may comprise a second layer of Group III-V semiconductor material having an interface with the Group IV semiconductor layer at the opposite side of the Group IV layer to the interface with the first Group III-V layer and may comprise a second silicon layer at the interface between the second III-V semiconductor layer and the Group IV layer.

The present invention also provides a photovoltaic device comprising a light absorbing cell comprising the semiconductor material of the invention.

The photovoltaic device may comprise a plurality of light absorbing cells, one or more of which comprises a semiconductor material of the invention. One of the plurality of cells may have a different bandgap from another one of the cells of the plurality. The light absorbing cell(s) may be a light absorbing p-n diode. The photovoltaic device may be a solar cell.

The present invention further provides a method of making a semiconductor material comprising:
  providing a Group IV semiconductor material layer, the material not being silicon,
  providing a layer of Group III-V semiconductor material formed of at least one kind of Group III atoms and at least one kind of Group V atoms, and having an interface with the Group IV semiconductor layer,
  providing a silicon layer either at the interface between III-V semiconductor layer, or in either the Group IV semiconductor layer or the III-V semiconductor layer, spaced from the interface,
  diffusing Group V atoms from the Group III-V material layer through the silicon layer to dope the Group IV material to form an n-type Group V doped region in the Group IV semiconductor layer that has a border with the interface.

The diffusing of the Group V atoms may form a p-n junction in the Group IV layer.

The diffusing of the Group V atoms may be into a region of the Group IV layer that was already n-type to form a region of n-type doping having a higher concentration on n-type dopants.

The Group III-V layer may be grown directly on the Group IV layer or on the silicon layer.

Materials in accordance with the invention or made by the method of the invention may be used to generate power from sunlight by:
  providing a solar cell formed of those materials, and
  irradiating the solar cell with sunlight. That may comprise the step of concentrating the sunlight that irradiates the solar cell.

In a second aspect of the invention there is provided a multijunction photovoltaic device having two or more light absorbing cells formed from semiconductor layers comprising:
  a first cell of silicon germanium or silicon germanium tin material,
  a second cell of silicon germanium tin material,
  wherein the silicon germanium or silicon germanium tin of the first cell and the silicon germanium tin of the second cell are lattice matched to gallium arsenide.

The multijunction photovoltaic device may further comprise a cell of gallium arsenide material.

The multijunction photovoltaic device may further comprise cell of indium gallium phosphide lattice matched to gallium arsenide.

The multijunction photovoltaic device may further comprise a cell of aluminium gallium arsenide lattice matched to gallium arsenide or a cell of aluminium indium gallium phosphide lattice matched to gallium arsenide.

The multijunction photovoltaic device may comprise a gallium arsenide substrate, the semiconductor layers of the cells being on and lattice matched to the substrate. Alternatively, the multijunction photovoltaic device may comprise a substrate that is lattice matched to gallium arsenide, the semiconductor layers being on and lattice matched to the substrate.

The multijunction photovoltaic device may be a solar cell.

Preferably the first cell is of silicon germanium material.

The second aspect of the invention also provides a method of making a multijunction photovoltaic device comprising:
  providing a substrate of gallium arsenide or another material that is lattice matched to gallium arsenide,
  growing a first cell of silicon germanium or silicon germanium tin material lattice matched to the substrate,
  growing a second cell of silicon germanium tin material lattice matched to the first light absorbing cell.

The method may comprise growing a cell of gallium arsenide material.

The method may comprise growing a cell of indium gallium phosphide material lattice matched to gallium arsenide.

The method may comprise growing a light absorbing layer of aluminium gallium arsenide material lattice matched to gallium arsenide.

The method may comprise growing a cell of aluminium indium gallium phosphide lattice matched to gallium arsenide.

The method may comprise providing at least one further layer between two neighbouring ones of the said cells, the at least one further layer being lattice matched to gallium arsenide.

The method may comprise removing the substrate.

BRIEF DESCRIPTION OF FIGURES

Examples of the invention will now be described with reference to the accompanying drawings, of which.

DETAILED DESCRIPTION

Figure 1:
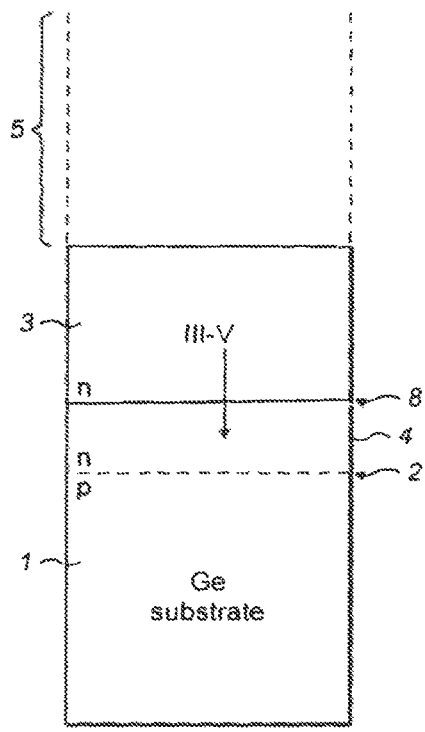
FIG. 1 is a cross-section of the semiconductor layers of the lower cell of a known multi-junction photovoltaic cell.
Figure 2:
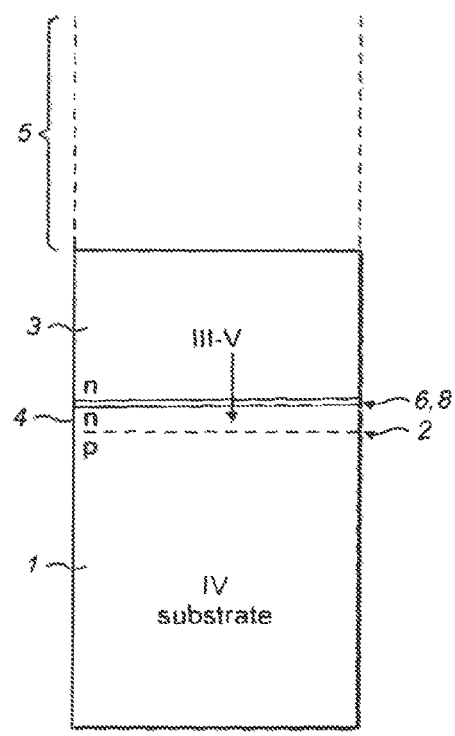
FIG. 2 is a cross-section of the semiconductor layers of the lower cell of a first example of a multi-junction photovoltaic device in accordance with the invention.

A first example of a photovoltaic device in accordance with the invention is illustrated by FIG. 2. This shows a cross-section of the layers of the lower cell with, if present, further semiconductor layers 5 forming one or more further p-n junctions being indicated by dashed lines. Generally, the structure is similar to that shown in FIG. 1. A p-type Group IV semiconductor substrate 1, for example germanium, is provided, together with a layer 3 of n-type III-V semiconductor grown on it, the two again meeting at interface 8. Also again Group V atoms from the III-V layer 3 diffuse into the Group IV layer forming an n-type region 4 adjacent to the interface 8, which provides a p-n junction 2 where that region meets the remaining p-type part of the Group IV material. However, a thin layer of silicon 6 is first provided between the layer 3 and the Group IV substrate 1. (Possibilities for the particular Group IV semiconductor material are discussed later below, but the material is not silicon itself. Possibilities for the Group III-V material are also discussed later.)

Figure 3:
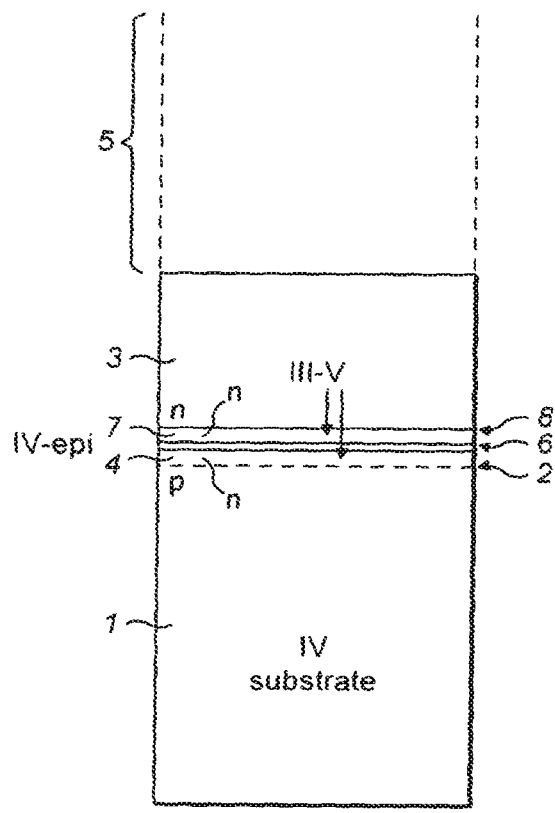
FIG. 3 is a cross-section of the semiconductor layers of the lower cell of a second example of a multi-junction photovoltaic device in accordance with the invention.

FIG. 3 shows a second example, which is similar to the first except a layer 7 of epitaxial Group IV semiconductor (other than silicon itself) is first grown on the Si layer 6 before the nucleation layer 3 of III-V material is grown on that. In general, this layer 7 could be doped initially, as it is grown, either p- or n-type.

In both these examples, the silicon layer 6 acts to control the diffusion of the Group V atoms from the layer 3 into the Group IV material. The silicon acts as a barrier to the Group V diffusion and so under the same set of processing conditions used to form the device the p-n junction 2 is shallower, i.e. the position of the p-n junction is closer to the interface 8 between the Group IV semiconductor and the nucleation layer. The barrier is not total; it reduces, rather than eliminates entirely, the Group V diffusion into the Group IV material that is on the opposite side of the Si barrier from the III-V material that is the source of the Group V atoms. Setting the barrier thickness can be used to control the depth of the p-n junction 2.

In both those examples, the preferred thickness of the barrier 6 is 3 mono layers (7.5 Å) of silicon or less. Indeed, it may be less than a single complete mono layer. The 3 mono layers is the preferred maximum thickness for the silicon layer because the silicon layer is strained (because it is trying to match the lattice parameter of the Group IV semiconductor). Above that critical thickness, dislocations form in the silicon to relieve the strain, and those dislocations would be disadvantageous to device performance. The range up to 3 monolayers also produces the depths of junction preferred in photovoltaic devices.

In the second example (FIG. 3) the thickness of the Group IV epilayer 7 should preferably not exceed the distance over which the Group V atoms diffuse through the material of that Group IV semiconductor material during the processing of the device, since beyond that distance the amount of Group V atoms traversing the Si barrier will be minimal. Typically, that distance is up to a 1 μm, depending on the Group V species being used and the temperatures of the steps of the processing of the device.

(A point to note about the example of FIG. 3 is while generally the p-n junction 2 is on the other side of silicon barrier 6 from the III-V layer, the invention generally includes the case where the barrier 6 limits the diffusion of the Group V atoms but not enough pass through the barrier to convert the Group IV material to n-type, the p-n junction being at, or around*, the barrier (*a p-n junction of course having an extent larger than the few mono layers of the barrier).)

Figure 4:
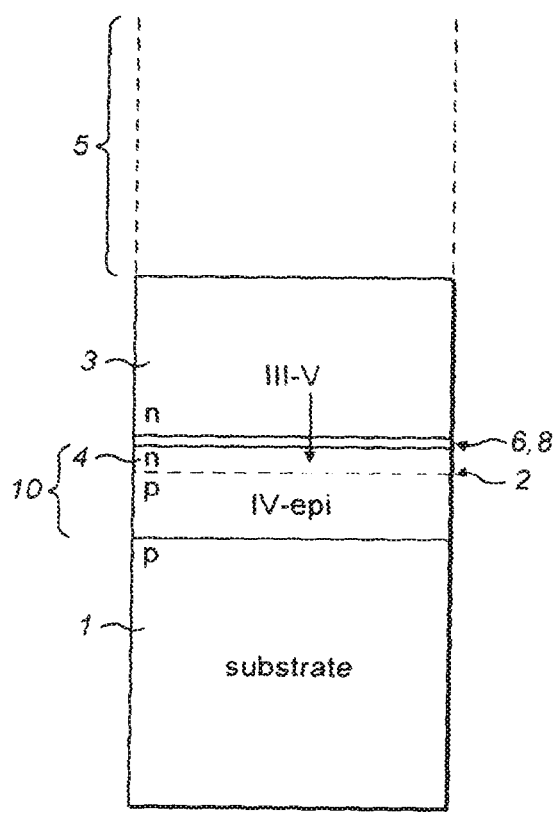
FIG. 4 is a cross-section of the semiconductor layers of the lower cell of a third example of a multi-junction photovoltaic device in accordance with the invention.
Figure 5:
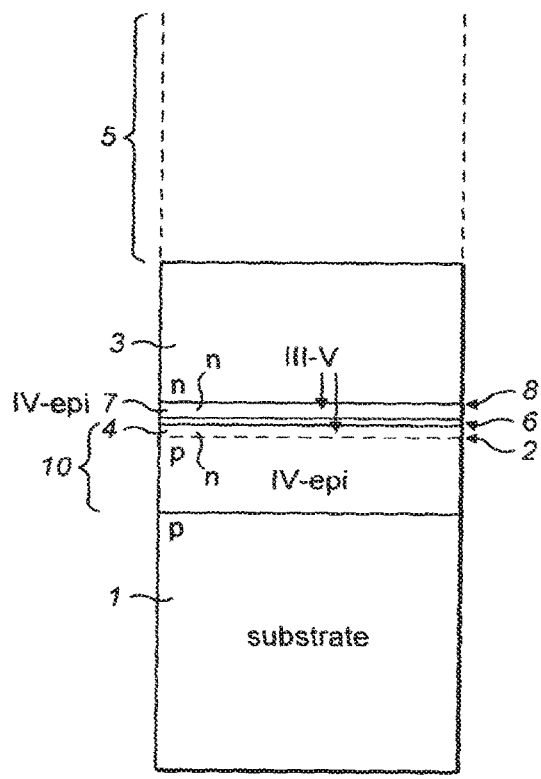
FIG. 5 is a cross-section of the semiconductor layers of the lower cell of a fourth example of a multi-junction photovoltaic device in accordance with the invention.

FIGS. 4 and 5 show third and fourth examples having the same layers respectively as the first and second examples (FIGS. 2 and 3), but an epitaxial layer 10 of p-type Group IV semiconductor is first provided before the silicon layer 6 and the III-V layer 3 are grown. In this particular example the epi-layer 10 is grown on the substrate 1, but having intermediate layers is possible. Having the layer 10 as an epi-layer also helps to accurately control the thickness and doping profile of the junction in the Group IV semiconductor material. Preferably layer 10 is thick enough that the p-n junction 2 forms in this Group IV epilayer 10, as shown, rather than in the substrate 1 (or in an intermediate layer of Group IV material), but the latter are not excluded. Note also however that that substrate 1 need not be Group IV material since the Group IV epi-layer 10 can be grown on other materials.

Figure 6:
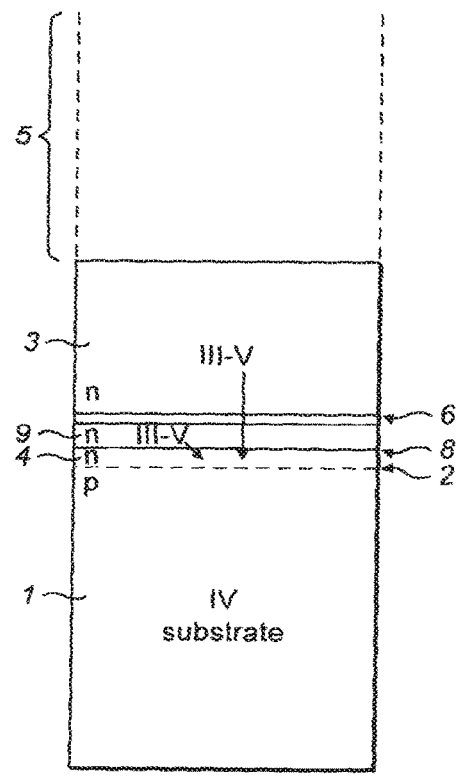
FIG. 6 is a cross-section of the semiconductor layers of the lower cell of a fifth example of a multi-junction photovoltaic device in accordance with the invention.
Figure 7:
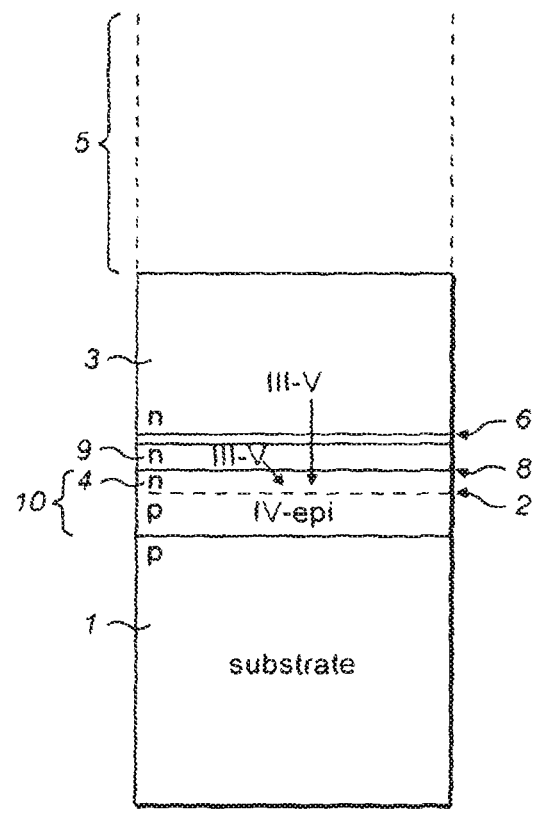
FIG. 7 is a cross-section of the semiconductor layers of the lower cell of a sixth example of a multi-junction photovoltaic device in accordance with the invention.

FIGS. 6 and 7 show fifth and sixth examples having the same layers respectively as the first and third examples (FIGS. 2 and 4), but an epitaxial layer 9 of n-type III-V semiconductor material is first provided on the Group IV layer(s) before the silicon layer 6 and the main III-V layer 3 are grown. Again, the silicon layer acts as a barrier to control the diffusion of Group V atoms from the layer 3 into the Group IV material on the other side of the barrier 6. The Group IV material is also doped by Group V atoms diffusing from layer 9. For the presence of the Si barrier to make a significant difference to the level of doping in the Group IV layer from the group III-V layer on the other side of the barrier this III-V epilayer 9 should be thinner than the distance the Group V atoms from the layer 3 will diffuse through layer 9 under the processing conditions of the device.

An example of the Group IV semiconductor material used to be the material in which the p-n junction is formed is germanium. Also germanium substrates are readily available. The preferred orientations for germanium as the substrate are slightly misaligned from (100) and (111). (Substrates misaligned from exact crystal planes are known generally in the art.)

Figure 13:
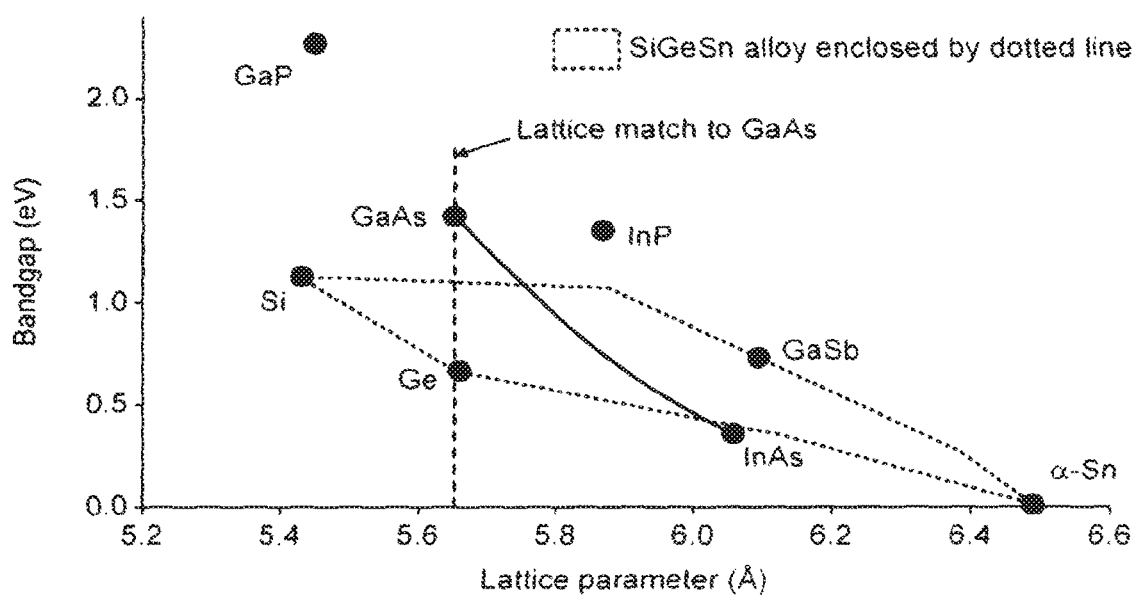
FIG. 13 is a graph showing the bandgap and lattice parameter of the alloy SiGeSn, showing that it can be lattice matched to GaAs and Ge and the resultant bandgaps.

Group IV semiconductors other than germanium can also be used, such as silicon-germanium and silicon-germanium-tin. SiGe, and SiGeSn, are not available as a basic substrate but can be grown lattice matched on GaAs. Such SiGe or SiGeSn can also be removed from its original GaAs substrate and attached to a cheaper substrate before use in the invention. Examples of this process are described later below. $Si_xGe_{1-x}$ with a composition with x of up to at least 0.04, and perhaps x=0.06 or more, may be used, but preferably x is in the range $0.01 \leq x \leq 0.03$. The corresponding lattice mismatch of the $Si_xGe_{1-x}$ with GaAs will be about 0.04% for every change of 0.01 in x away from the lattice matched condition at about x=0.018. FIG. 13 is a graph showing the bandgap and lattice parameter of the alloy SiGeSn, showing that it can be lattice matched to GaAs with a bandgap range for the SiGeSn of 0.66-1.1 eV. It also shows that SiGeSn can be lattice matched to Ge and since the lattice parameter of Ge is fairly close to that of GaAs the range of bandgaps over which SiGeSn can be lattice matched to Ge is similar to that given above for SiGeSn lattice matched to GaAs. SiGeSn is lattice matched to GaAs where the ratio of Si to Sn is approximately 4:1. Where for example the proportion of Si is 2% and that of Sn is 0.5% this provides a larger bandgap than SiGe lattice matched to GaAs, where the proportion of Si is 8% and that of Sn is 2% the bandgap is wider, and where the proportions are much larger the bandgap can extend further—for example at the limit of 80% Si and 20% Sn the bandgap of that material is around 1.1 eV.

As is known in the art, the nucleation layer 3 can be made from various III-V materials, such as InGaAs, InGaP. Other materials are InGaAsP, AlGaAs, AlGaAsP, GaAs, GaAsP, AlAs, InGaP, InGaAs, AlInGaAs, AlInGaP, etc. They also include those including Sb (or possibly Bi) as the, or a one of, the Group V atom(s) of the material. As is known in the art most of these materials can be grown lattice matched, or nearly so, to at least one of germanium, silicon, or silicon-germanium, silicon-germanium-tin.

Many of these materials contain As and/or P for the Group V atoms. It is noted here that both As and P diffuse from the Group III-V material into the Group IV material, with, for Ge at least for the Group IV material, As diffusing further and faster than P.

Where there is more than one III-V epitaxial layer (e.g. the examples of FIGS. 6 and 7 have epitaxial layers 3 and 9) it is preferred that these layers of have the same composition in terms both the Group III and V atoms making up the basic material but also in doping provided during deposition. However differences are possible and that may be useful to control the doping profile in the Group IV region. Indeed differences within a layer are also not excluded.

Similarly where there is more than one Group IV epitaxial layer (e.g. the example of 5) it is preferred that these layers have the same composition in terms of both the Group IV atoms making up the basic material but also in doping provided before the Group V diffusion discussed above, e.g. during deposition of the Group IV material. However differences are possible. Indeed differences in composition and/or doping within a layer are also not excluded.

However, as is frequently done in the art for epitaxial layers, even when the epi-layer and the substrate are the same basic material, it is preferred for group IV epilayer and the substrate (FIGS. 4, 5 and 7) to have different doping.

As foreshadowed above with the examples of SiGe and SiGeSn grown on GaAs, materials for the Group IV layer 10 can be grown on substrates of non-Group IV materials.

Some doping concentrations that may be used, or preferred, are as follows. For the III-V layer at the interface with the Group IV layer the doping concentration would normally be greater than $1 \times 10^{17}$ atoms per $cm^3$; more preferably it would be greater than $1 \times 10^{18}$ atoms per $cm^3$, and still more preferably it would be between $1 \times 10^{18}$ atoms per $cm^3$ and $5 \times 10^{18}$ atoms per $cm^3$. The number of diffused Group V atoms forming the doping in the Group IV material would normally be greater than $1 \times 10^{17}$ atoms per $cm^3$; it would preferably be greater than $1 \times 10^{18}$ atoms per $cm^3$ and may be greater than $6 \times 10^{18}$ atoms per $cm^3$. For the remainder of the Group IV layer (not diffused significantly by the Group V atoms) the doping concentration would normally be less than $4 \times 10^{18}$ atoms per $cm^3$; preferably it would be between $5 \times 10^{16}$ atoms per $cm^3$ and $2 \times 10^{18}$ atoms per $cm^3$ and more preferably it would be between $1 \times 10^{17}$ atoms per $cm^3$ and $1 \times 10^{18}$ atoms per $cm^3$.

The silicon layer 6 and other layers can be grown using conventional techniques. Some possible methods are as follows.

The silicon layer can, for example, be grown in a conventional MOCVD reactor that is also used to provide the epitaxy of the III-V layers (such a tool is conventionally used for III-V epitaxy of multi-junction photovoltaic devices). This is particularly suited to, but not limited to, the first example (FIG. 2) since the germanium substrate (taking that as an example of the Group IV semiconductor material) can be placed straight in the MOCVD reactor, which is then used to grow both the silicon and III-V layers in turn. Silicon is used as a dopant source in such reactors and is therefore available to be used to deposit the silicon directly onto the germanium substrate prior to III-V nucleation layer.

The silicon layer 6 can also be grown epitaxially in a CVD deposition tool used for the growth of germanium, silicon and silicon-germanium or silicon-germanium-tin. This particularly suited to, but not limited to, the second example (FIG. 3) since the germanium etc. substrate can first be placed in the tool and then the silicon and Ge epitaxial layers 6 and 7 grown in turn. The work piece can then be transferred to a MOCVD rector (preferably using a cluster tool arrangement so that germanium epitaxial layer 7 remains clean) for deposition of the III-V layer 3.

MBE may also be used for the deposition of III-V materials or of silicon.

Figure 8:
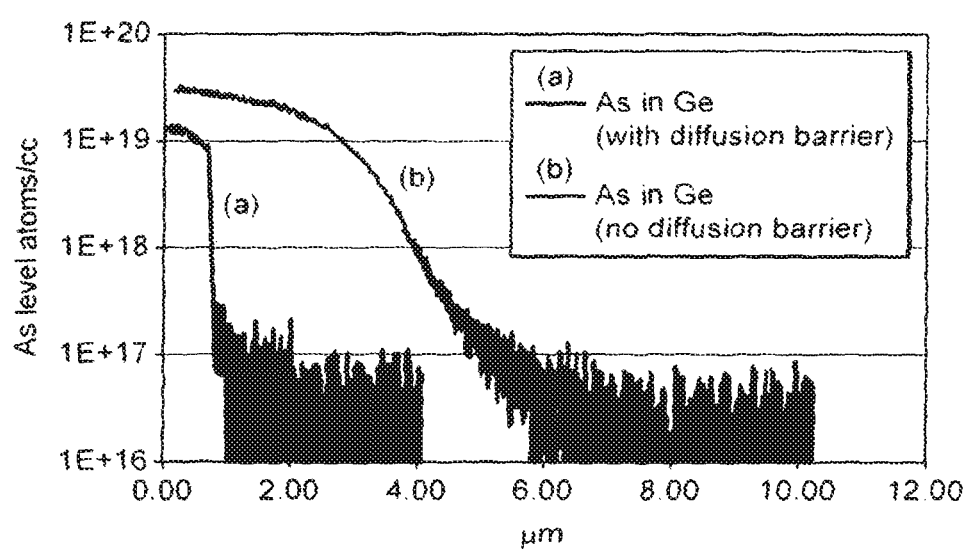
FIG. 8 is a secondary ion mass spectrometer plot comparing semiconductor layer structures with and without the silicon layer of the invention.

FIG. 8 is a plot from a secondary ion mass spectrometer comparing samples of multi-junction tandem cell device having a InGaAs/Ge junction for the bottom cell (a) with and (b) without the silicon layer of the invention directly at the interface. The vertical axis is the concentration of As atoms in the Ge in atoms/$cm^3$ and the horizontal axis is the depth into the Ge layer in microns. The graph clearly shows that with the silicon layer the As dopant diffused into the InGaAs layer is confined to a depth of 1 μm into the Ge layer ((a)), while in the control without a Si layer, but otherwise with same process conditions, the As atoms have penetrated to about 4 μm((b)). Further the concentration of As atoms is lower in the sample with the Si layer. These observations demonstrate that the Si layer acts as a barrier to diffusion of the As. Similar results are obtained with III-V semiconductor materials having different Group V atoms.

Triple junction photovoltaic structure samples having a silicon layer in accordance with the invention have also been measured to provide a useful increase in the maximum power output when irradiated by 1-sun compared to those without, and also in the open circuit voltage ($V_{oc}$).

Figure 9:
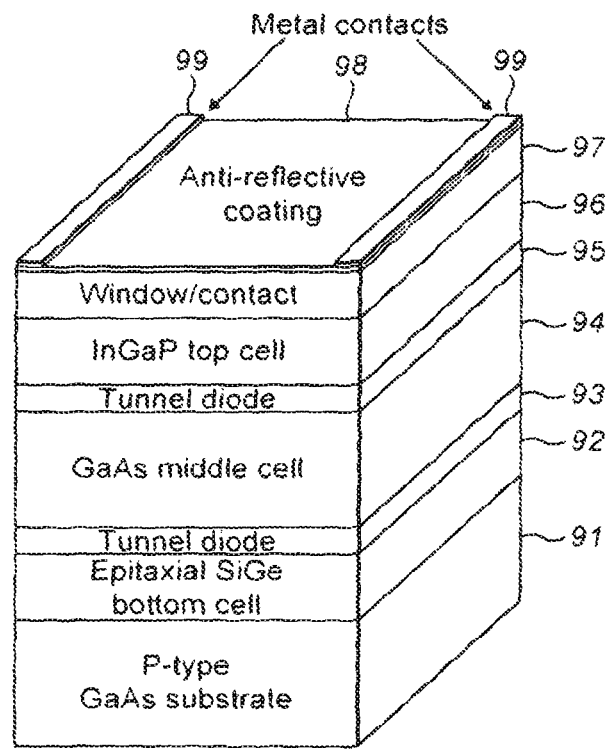
FIG. 9 is another example of a device using the invention.

FIG. 9 shows another example of a multi-junction solar cell, which makes use of the invention, this time illustrating all the cells. The Figure shows the tandem arrangement of the cells of the device (each of which is made up of various semiconductor layers, but these are not shown in detail). This device starts with a GaAs substrate 91 on which is grown a SiGe cell 92 in accordance with the invention (so comprising a SiGe layer having the p-n junction, a Si diffusion barrier layer and a III-V layer above (for example GaInP) that providing the doping, none of which are shown in detail in the Figure within the cell 92). Above that are provided a GaAs cell 94 and a InGaP cell 96. Tunnel diodes 93 and 95 respectively between the SiGe and GaAs cells and between the GaAs and InGaP cells reduce the resistance between the cells. Finally a window layer 97 protects the device but allows the light in and metal contact lines 99 thereon collect the current produced by the device. Finally an anti-reflective coating 98 covers the window.

Figure 9A:
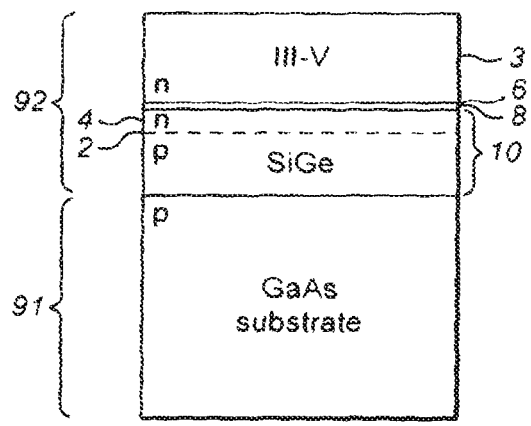
FIGS. 9A and 9B show examples of the use of the invention in a cell of the device of FIG. 9, FIGS. 10A to 10D illustrate a method of forming an example of the invention involving the transfer of a SiGe layer between substrates.

FIG. 9A shows an example of the bottom cell 92 and substrate 91 of FIG. 9 in more detail (although of course use of this example is not limited to the particular example of FIG. 9). This has the structure of the example of FIG. 4 with the substrate 1 being GaAs. On that is grown an epi-layer 10 of p-type SiGe largely (or exactly) lattice matched to the GaAs. On that is grown the Si diffusion 6 barrier and on that a III-V nucleation layer 3, again largely (or exactly) lattice matched to the SiGe. The Group V atoms diffuse from layer 3, under the conditions of the deposition of layer 3 and of subsequent processing steps, controlled by the barrier 6, into the SiGe, doping it to form n-type region 4 next to the interface 8 and hence the p-n junction 2 in the SiGe layer 10. In a similar example to this the SiGe layer 10 is made instead from SiGeSn.

In this device doping of the SiGe (or SiGeSn) with Group V atoms from the GaAs substrate 1 is a potential problem: overdoping of the SiGe from p-type to n-type by As atoms to form another p-n junction in the SiGe near the interface between the SiGe 10 and the substrate 1.

This can be addressed in two ways. First, another Si barrier 14 can be provided at that interface to reduce the diffusion to a level where the SiGe remains p-type. (A thickness of 7.5 Å, or 3 atomic layers, is for the Si barrier 6 and 14 is preferred. This limit is as the earlier examples above because the Si is being grown to the lattice parameter of the GaAs substrate which is very similar to that of Ge.)

Another way is to avoid the problem by transferring the SiGe onto a different substrate before subsequent processing steps are carried out. This transfer is described below and in our International patent application published as WO2010094919 published on 26 Aug. 2010, which is incorporated herein by reference.

For this the SiGe layer 10 can be grown (FIG. 10A) on the GaAs substrate 1 using an epitaxy process, lattice matched, using a gas mixture of a germanium containing precursor (e.g. $GeH_4$, $GeCl_4$, etc) and a silicon containing precursor (e.g. $SiH_4$, $SiH_2Cl_2$, $SiHCl_3$, disilane, etc) with a carrier gas (e.g. H2). The SiGe layers 10 can be in-situ doped with p-type dopants, using gaseous or solid doping sources including, but not limited to, diborane. The layer 10 can be grown, for example, at atmospheric pressure or reduced pressure in the range 1~1000 Torr, and temperature 350° C.~800° C. A range of GaAs substrates may be used including p-type, n-type and semi-insulating, and the wafers may be cleaned ex-situ or in the process chamber prior to epitaxy. Crystallinity properties of the SiGe layer 10 may be measured using X-ray diffraction techniques, for example to check lattice matching, and the thicknesses of the layers may typically be monitored using variable angle spectroscopic ellipsometry, although other techniques are available.

In this process, the change of material composition between the GaAs substrate and the SiGe layer 10 provides a hetero-interface which acts as a good etch-stop, enabling the GaAs substrate to be removed conveniently and accurately to leave a smooth surface of the SiGe layer 10. Some of the GaAs substrate may be removed by mechanical means if this provides more rapid or otherwise convenient or cost-effective manufacture process. For example, if the GaAs substrate is 500 μm thick, about 400 μm may be removed by grinding from which the GaAs material can be more easily recovered and re-used, and the final 100 μm may be removed by selective wet etching.

The photovoltaic cell structure resulting from use of this method can be of lighter weight because the substrate thickness has been removed, which may be important particularly in space-based applications. An alternative base which has favourable flexibility, thermal behaviour, or other desirable mechanical or electrical properties may be advantageously provided. Replacement of the substrate with a heatsink can result in more efficient thermal conduction away from the device because the substrate no longer acts to reduce the flow of heat. The heatsink or another metallic base layer can act directly as a conductive electrode to the bottom of the device.

Figure 10A:
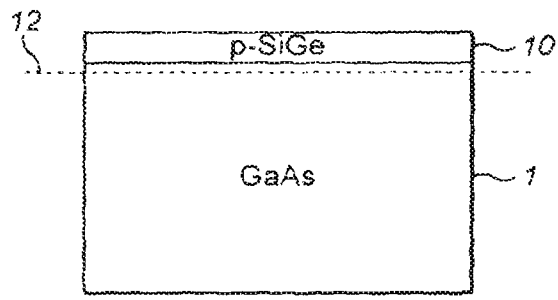

A particular technique is illustrated in FIGS. 10A-10D. Starting with a GaAs substrate 1, a layer 10 of SiGe is grown epitaxially as previously described, and as shown in FIG. 10A. A layer transfer technique is then used to remove all but a thin layer of the GaAs substrate. The layer transfer may be achieved using a proprietary exfoliation technique such as Smart Cut® or similar, in which a cleave plane 12 is formed in the GaAs substrate just beneath the layer 10 of SiGe. The cleave plane 12 may be formed using ion beam implant techniques to deposit hydrogen or helium atoms at a precise depth determined by the beam particle energy, for example at depths of up to about 1.5 μm, making the technique practical in the present context if the thickness of the layer of SiGe is of approximately this thickness.

Figure 10B:
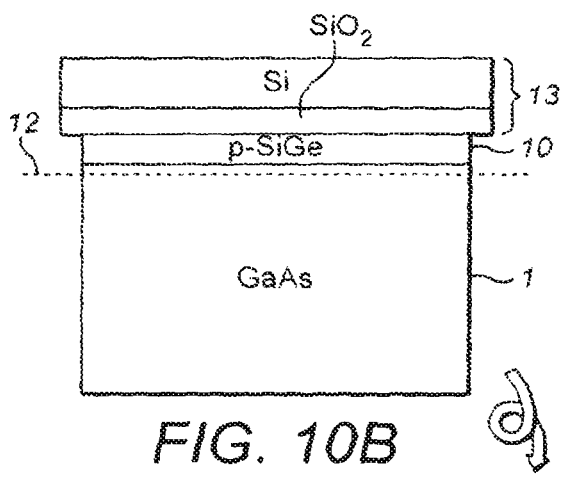
Figure 10C:
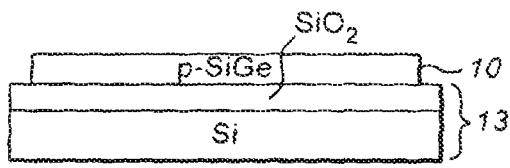

An alternative base 13 is then bonded to the SiGe layer 10. As shown in FIG. 10B the alternative base may be an oxidised silicon wafer such that the SiGe layer is bonded to a layer of $SiO_2$, although other bases may be used such as the metallic heat sink layer discussed above. Some other bases which can be used are metallic, glass and semiconductor bases, which may themselves already comprise two or more layers selected from metal, semiconductor and insulator materials, and may include active elements such as one or more photovoltaic junctions. The bulk of the GaAs substrate is then separated from the structure, and the fine remaining layer of GaAs is removed, for example by selective wet etching, to leave the layer 10 of SiGe on an alternative base such as the oxidised silicon wafer discussed, and as shown in FIG. 10C. Subsequent layers of the device are then formed as shown in FIG. 10D, for example the Si barrier 6 and the III-V layer 3 and subsequent layers 5.

One variation of the described technique is to form the cleave plane just above the interface with the substrate, within the lower SiGe layer. Following layer transfer the transferred SiGe is already exposed for any necessary further preparation. The residual SiGe remaining on the GaAs substrate can be removed, at least partially using a wet etch selective for SiGe and ineffective on GaAs, to leave a reuseable GaAs substrate wafer.

Figure 10D:
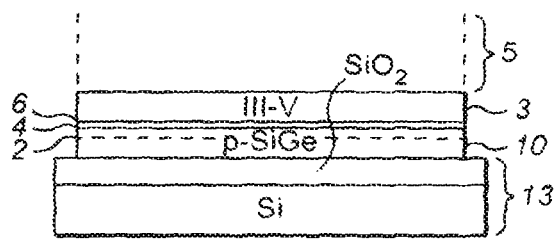

A wide variety of different alternative bases may be contemplated for the structure of FIG. 10D, including metallic, glass, and semiconductor bases, which may themselves already comprise two or more layers selected from metal, semiconductor, and insulator materials, and may include active elements such as one or more photovoltaic junctions. The initial formation of the SiGe layer on a GaAs substrate provides an ideal etchstop for accurate removal of the remaining GaAs following cleaving or exfoliation.

Figure 11:
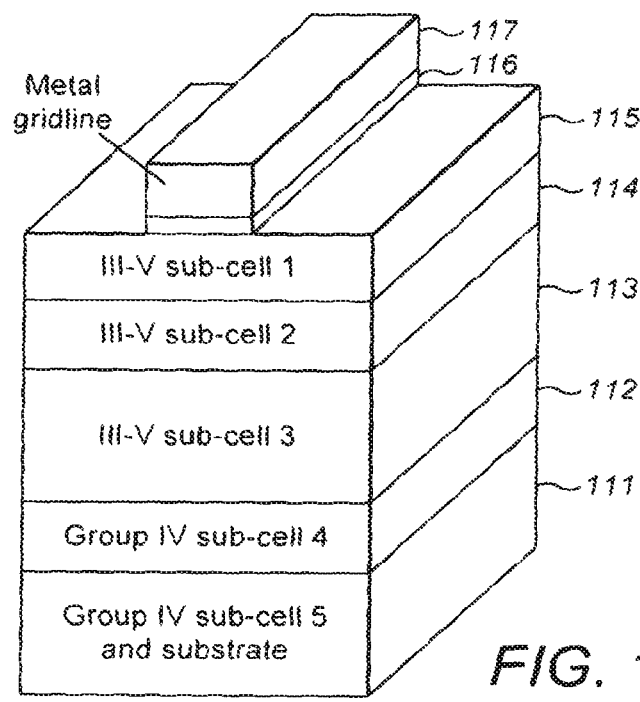
FIG. 11 is a further example of a device using the invention.

FIG. 11 shows a further example of a multi-junction solar cell, which makes use of the invention. This shows a five cell solar cell device, again with all the cells connected in tandem. These are, in order from the substrate, a Ge cell 111, another Ge cell 112, a GaInAs cell 113, an AlGaInAs cell 114 and a AlGaInP cell 115 (covered by a heavily n-type contact layer 116 and metal lines 117). In this device the invention is used to form the Ge cell 112; this has an interface with the III-V material of the cell 113 above, which provides the Group V dopant so the Si diffusion barrier 6 is provided at the interface between cells 112 and 113.

Figure 11A:
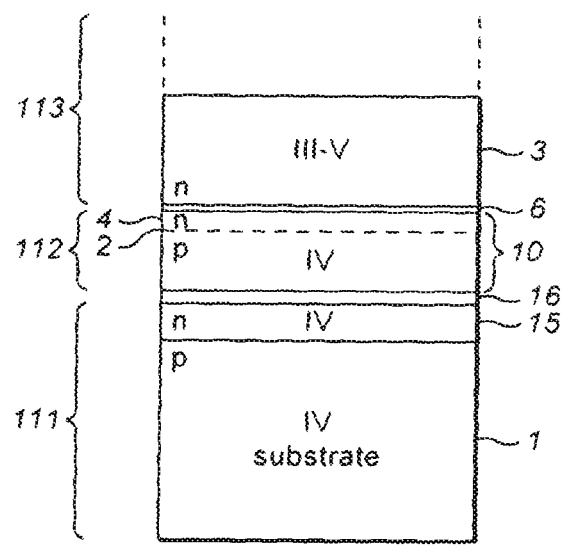
FIGS. 11A to 11D show examples of the use of the invention.

FIG. 11A shows an example of the bottom cells 111, 112 of FIG. 11 in more detail, although of course its use is not limited to the particular example of FIG. 11.

The lowest cell 111 has a p-type Group IV substrate 1 (for example Ge) on which is grown n-type Group IV (for example Ge) epilayer to form the first p-n junction. In order to provide a low resistance contact to the next cell 112 the layers 16 of a tunnel diode are deposited next. On top of that are formed epilayer 10 of p-type Group IV material (for example Ge) followed by a silicon diffusion barrier 6 and a Group III-V epilayer 3 to form in the manner of the examples above a p-n junction 2 between the n-type material 4 of the epilayer 10 doped by Group V atoms diffused through the barrier 6 from the epilayer 3 and the remainder of the Group IV layer 10, thereby forming cell 112.

Figure 11B:
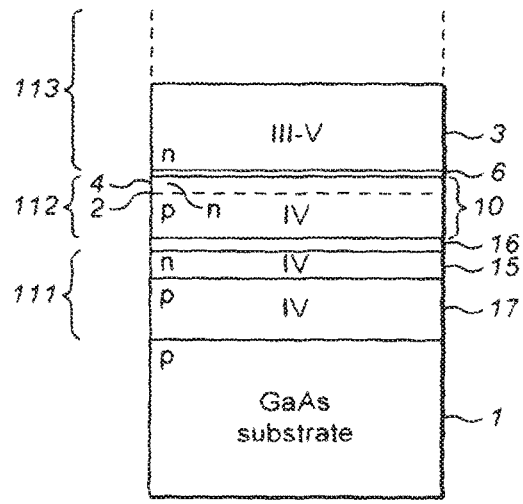

FIG. 11B shows another example that is similar to that of FIG. 11A. However in this example first cell does not include the substrate but is made of an additional Group IV epi-layer 17 that is p-type grown on the substrate 1 (generally lattice matched to the substrate) with the n-type Group IV layer 15 grown on top of that to form the p-n junction of the first cell.

In a particular example of the example of FIG. 11B the material of the substrate is GaAs (as marked in FIG. 11B (and in FIG. 11C)). The Group IV layers are then preferably ones that can be grown generally lattice matched to that, examples of which are SiGe and SiGeSn. SiGe provides a bandgap of 0.66 eV when lattice matched to GaAs and SiGeSn provides a bandgap of greater than that, up to ~1.1 eV. If two bandgaps of greater than 0.66 eV are desired, while remaining lattice matched to GaAs, then the lowest cell 111 and the next cell 112 can both be made of SiGeSn but with different compositions to each other to provide the desired bandgaps.

Figure 9B:
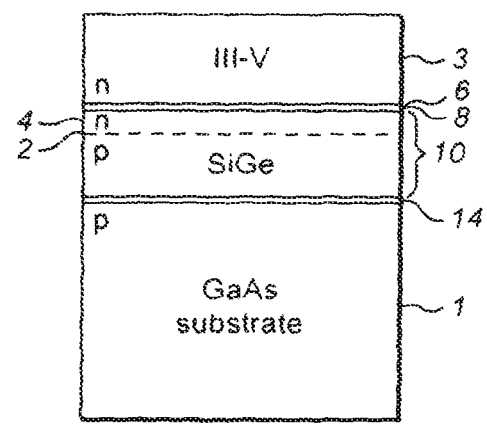
Figure 11C:
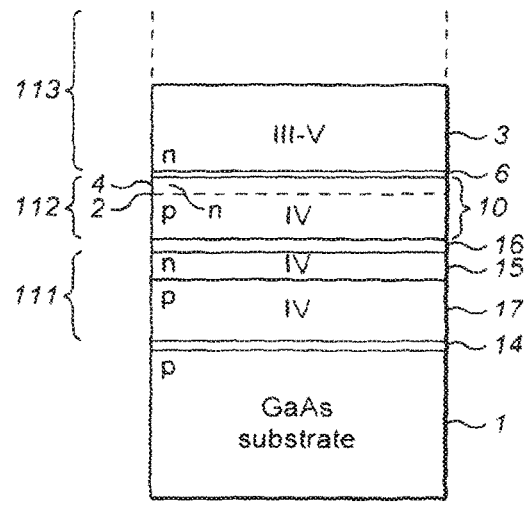

FIG. 11C shows a further example that is similar to that of FIG. 11B but in this example an additional Si diffusion barrier 14 is provided (like that of example of FIG. 9B) to prevent the formation of an unwanted p-n junction in the Group IV material layer 17 when the substrate is a III-V material (for example GaAs).

Figure 11D:
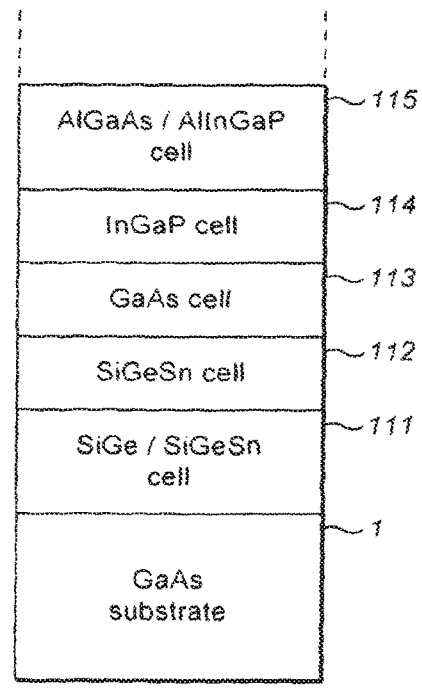

FIG. 11D shows another example of a multi-junction solar cell. As with the examples of FIGS. 11B and 11C a first cell of SiGe or SiGeSn is provided on a GaAs substrate and above that is provided a second cell of SiGeSn. In this example a further three cells are provided, also in tandem: a third cell of GaAs above the second cell, a fourth cell of InGaP above the third cell and a fifth cell of AlGaAs or AlInGaP above the fourth cell. All the cells are all lattice matched to the GaAs substrate. (Although AlGaAs does not have exactly the same lattice parameter as GaAs, it is nearly equal enough so to still be lattice matched, only with a small strain where the AlGaAs layer is below the critical thickness where strain relieving dislocations would occur. This applies throughout its compositional range of the proportion of aluminium to gallium. In this example, the other materials have compositions that are exactly lattice matched to GaAs, which compositions are used for preference.) An example of the bandgaps of the cells are in order from the first cell to the last: 0.7 eV, 1.0 eV, 1.4 eV, 1.8 eV 2.0 eV.

Each cell therefore absorbs a different part of the spectrum of the light falling on the device. The device may be provided, if desired, with the Si barriers, tunnel diodes, window layers etc. mentioned in the other examples. Also the substrate may be removed as described with reference to FIG. 10A to 10D. Further the materials of the cells may be grown not on GaAs itself but on another substrate that is lattice matched to GaAs. Other layers may be used between the light absorbing cells, for example, tunnel diodes, and these are preferably lattice matched to the cells and also preferably to the substrate.

Figure 12:
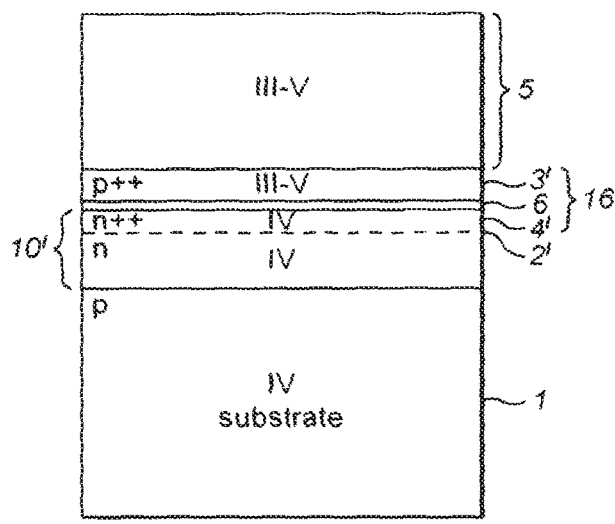
FIG. 12 is an example of a tunnel diode using the invention.

FIG. 12 shows the layers of an example of another aspect of the invention. Here the Si diffusion barrier 6 between Group IV 10' and Group III-V layers 3' controls the diffusion of Group V atoms through the barrier into Group IV material that is already n-type, the diffused region 4' produced therefore being highly n-doped. In this example, layers 3' and 4' form a tunnel diode 16.

The example shown in FIG. 12 shows the tunnel diode in combination with a Group IV photocell (and so this example will be of use in tandem photovoltaic devices). A p-type Group IV substrate 1 is provided on which is grown an n-type Group IV epilayer 10', which junction provides the photovoltaic cell. Above that is provided a thin Si diffusion barrier 6 and on top of that a highly doped layer 3' of Group III-V material the Group V atoms of which diffuse through the barrier to form the highly doped n++ region 4'. Above that may be grown other layers 5 for example other photovoltaic cells, for example in III-V materials. The highly doped n++ Group IV region 4' and the highly doped p++ III-V layer 3' form a low resistance tunnel diode. 16, which allows photo current produced by the p-n junction between layers 1 and 10' to be conducted to the layers above without excessive resistive loss.

As with the earlier examples above the silicon barrier need not be exactly at the interface between the Group IV and Group III-V materials but may be at a distance to one side where it can still influence the diffusion of the Group V atoms.

In the above examples, the subcells may alternatively be grown in reverse order on a GaAs substrate (or a substrate lattice matched to GaAs, or other substrate appropriate to the lattice parameter of the structure) starting with the wider bandgap cells and then followed by in order smaller bandgap cells ending for example with the SiGe/SiGeSn cell. A sacrificial layer is provided between the widest gap cell and the substrate allowing the cells to be removed and transferred to a suitable handle or heat sink, inverted so that the narrowest bandgap cell is next to the substrate and the widest bandgap cell receives the incident light first.

Devices using these materials, typically solar cells, are usually manufactured by first providing a semiconductor material having the necessary layers, or at least some of those. Usually the material is made uniformly over a whole semiconductor wafer. The material is then processed with lithographic techniques to form individual devices and connections. The manufacture of the material is often carried out by a different manufacturer from that performing the lithographic and packaging steps.

The invention claimed is:

1. A semiconductor material comprising:
   a Group IV semiconductor material layer, the material not being silicon;
   a layer of Group III-V semiconductor material formed of at least one kind of Group III atoms and at least one kind of Group V atoms, and having an interface with the Group IV semiconductor material layer, the group IV semiconductor material layer being lattice matched to the Group III-V semiconductor material, wherein the Group IV semiconductor material, the Group III-V semiconductor material, and the interface have the same lattice parameter;
   a silicon layer either at the interface between III-V semiconductor layer and the Group IV semiconductor material layer, or in either the Group IV semiconductor material layer, or the III-V semiconductor layer, to control a diffusion of the Group V atoms into the Group IV semiconductor material layer; and
   an n-type Group V doped region in the Group IV semiconductor material layer that has a border with the interface and that is doped by Group V atoms which have diffused from the layer of Group III-V semiconductor through the silicon layer.

2. The semiconductor material as claimed in claim 1 wherein the Group V doped region in Group IV the semiconductor material layer provides a p-n junction with a p-type region in the Group IV semiconductor material layer.

3. The semiconductor material as claimed in claim 1, wherein the Group V doped region in the Group IV semiconductor material layer and the Group III-V layer form a tunnel diode at the interface.

4. The semiconductor material as claimed in claim 1 wherein the Group IV semiconductor material layer is germanium.

5. The semiconductor material as claimed in claim 1 wherein the Group IV semiconductor material layer is silicon-germanium, or is silicon-germanium-tin.

6. The semiconductor material as claimed in claim 1 wherein the Group III-V material comprises Group III atoms that are one or more of Al, Ga, In and comprises Group V atoms that are one or more or P, As, Sb, Bi.

7. The semiconductor material as claimed in claim 1 wherein the Group IV semiconductor material layer comprises an epitaxial Group IV semiconductor layer between the silicon layer and the III-V semiconductor layer.

8. The semiconductor material as claimed in claim 1 wherein the Group IV semiconductor material layer comprises a substrate layer and an epitaxial layer grown on the substrate layer.

9. The semiconductor material as claimed in claim 1 wherein the silicon layer has a thickness of less than or equal to 7.5 Å.

10. The semiconductor material as claimed in claim 1 wherein the silicon layer has less than or equal to 3 atomic layers.

11. The semiconductor material as claimed in claim 10, wherein the silicon layer has less than or equal to 1 atomic layer.

12. The semiconductor material as claimed in claim 11, wherein the silicon layer is less than 1 atomic layer.

13. The semiconductor material as claimed in claim 1 comprising a second layer of Group III-V semiconductor material having an interface with the Group IV semiconductor material layer at the opposite side of the Group IV semiconductor material layer to the interface with the first Group III-V layer and comprising a second silicon layer at the interface between the second III-V semiconductor layer and the Group IV semiconductor material layer.

14. A solar cell comprising:
    a light absorbing cell comprising:
        a semiconductor material comprising:
            a Group IV semiconductor material layer, the material not being silicon,
            a layer of Group III-V semiconductor material formed of at least one kind of Group III atoms and at least one kind of Group V atoms, and having an interface with the Group IV semiconductor material layer, the group IV semiconductor material layer being lattice matched to the Group III-V semiconductor material, wherein the Group IV semiconductor material, the Group III-V semiconductor material, and the interface have the same lattice parameter;
            a silicon layer either at the interface between III-V semiconductor layer and the Group IV semiconductor material layer, or in either the Group IV semiconductor material layer, or the III-V semiconductor layer, to control a diffusion of the Group V atoms into the Group IV semiconductor material layer; and
            an n-type Group V doped region in the Group IV semiconductor material layer that has a border with the interface and that is doped by Group V atoms which have diffused from the layer of Group III-V semiconductor through the silicon layer.

15. A method of making a semiconductor material comprising:
    providing a Group IV semiconductor material layer, the material not being silicon;
    providing a layer of Group III-V semiconductor material formed of at least one kind of Group III atoms and at least one kind of Group V atoms, and having an interface with the Group IV semiconductor material layer, the group IV semiconductor material layer being lattice matched to the Group III-V semiconductor material, wherein the Group IV semiconductor material, the Group III-V semiconductor material, and the interface have the same lattice parameter;
    providing a silicon layer either at the interface between III-V semiconductor layer, or in either the Group IV semiconductor material layer or the III-V semiconductor layer, to control a diffusion of the Group V atoms into the Group IV semiconductor material layer; and
    diffusing Group V atoms from the Group III-V material layer through the silicon layer to dope the Group IV semiconductor material layer to form an n-type Group V doped region in the Group IV semiconductor material layer that has a border with the interface.

16. The method as claimed in claim 15 wherein the diffusing of the Group V atoms forms a p-n junction in the Group IV semiconductor material layer.

17. The method as claimed in claim 15 wherein the diffusing of the Group V atoms is into a region of the Group IV semiconductor material layer that was already n-type to form a region of n-type doping having a higher concentration on n-type dopants.

18. The method of generating power from sunlight comprising:
    providing a solar cell as claimed in claim 14, and
    irradiating the solar cell with sunlight.

19. The method of generating power from sunlight comprising:
    providing a solar cell from a material made by the method as claimed in claim 15, and
    irradiating the solar cell with sunlight.

20. The semiconductor material of claim 1 wherein the Group IV semiconductor material layer is a first light absorbing layer and the layer of Group III-V semiconductor material is a second light absorbing layer disposed underneath the first light absorbing layer relative to an expected light source.

\* \* \* \* \*